(12) United States Patent
Wylie et al.

(10) Patent No.: US 7,091,604 B2
(45) Date of Patent: Aug. 15, 2006

(54) THREE DIMENSIONAL INTEGRATED CIRCUITS

(75) Inventors: Ian W. Wylie, Naperville, IL (US); Heinz H. Busta, Park Ridge, IL (US); David J. Schroeder, Aurora, IL (US); J. Scott Steckenrider, Plainfield, IL (US); Yuchun Wang, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 69 days.

(21) Appl. No.: 10/861,007

(22) Filed: Jun. 4, 2004

(65) Prior Publication Data

US 2005/0269665 A1    Dec. 8, 2005

(51) Int. Cl.
*H01L 23/34* (2006.01)

(52) U.S. Cl. ............ 257/713; 257/278; 257/706; 257/712; 257/714; 257/715; 257/716; 257/717; 257/721; 257/E23.08; 257/E23.082; 257/E23.097; 257/E23.098; 257/E23.099; 257/E23.101

(58) Field of Classification Search .......... 257/278, 257/706, 721, 712–717, E23.08, E23.082, 257/E23.097, E23.098, E23.099, E23.101
See application file for complete search history.

(56) References Cited

U.S. PATENT DOCUMENTS

| | | | | |
|---|---|---|---|---|
| 5,016,138 A | * | 5/1991 | Woodman | .......... 361/688 |
| 5,166,863 A | * | 11/1992 | Shmunis | .......... 361/699 |
| 5,202,754 A | | 4/1993 | Bertin et al. | .......... 257/684 |
| 5,241,450 A | * | 8/1993 | Bernhardt et al. | .......... 361/689 |
| 5,345,107 A | * | 9/1994 | Daikoku et al. | .......... 257/717 |
| 5,361,188 A | * | 11/1994 | Kondou et al. | .......... 361/695 |
| 5,394,299 A | * | 2/1995 | Chu et al. | .......... 361/705 |
| 5,426,072 A | | 6/1995 | Finnila | .......... 438/107 |
| 5,426,563 A | * | 6/1995 | Moresco et al. | .......... 361/689 |
| 5,880,010 A | | 3/1999 | Davidson | .......... 438/455 |
| 6,014,313 A | * | 1/2000 | Hesselbom | .......... 361/704 |
| 6,057,598 A | | 5/2000 | Payne et al. | .......... 257/723 |
| 6,166,403 A | | 12/2000 | Castagnetti et al. | .......... 257/211 |
| 6,329,722 B1 | | 12/2001 | Shih et al. | .......... 257/786 |
| 6,366,462 B1 | * | 4/2002 | Chu et al. | .......... 361/699 |
| 6,525,415 B1 | | 2/2003 | Koyanagi et al. | .......... 257/606 |
| 6,611,057 B1 | * | 8/2003 | Mikubo et al. | .......... 257/714 |
| 6,767,766 B1 | * | 7/2004 | Chu et al. | .......... 438/122 |
| 6,969,907 B1 | * | 11/2005 | Imai et al. | .......... 257/713 |
| 2002/0159233 A1 | * | 10/2002 | Patel et al. | .......... 361/702 |
| 2002/0159237 A1 | * | 10/2002 | Patel et al. | .......... 361/719 |
| 2003/0164231 A1 | | 9/2003 | Goodson et al. | |
| 2004/0089442 A1 | | 5/2004 | Goodson et al. | |

\* cited by examiner

*Primary Examiner*—Ida M. Soward
(74) *Attorney, Agent, or Firm*—Steven D. Weseman

(57) ABSTRACT

A three-dimensional integrated circuit that provides reduced interconnect signal delay over known 2-dimensional systems. The three-dimensional integrated circuit also allows improved circuit cooling. The three-dimensional integrated circuit includes two or more electrically connected integrated circuits, separated by a cooling channel.

20 Claims, 5 Drawing Sheets

THREE DIMENSIONAL INTEGRATED CIRCUITS

BACKGROUND OF THE INVENTION

1. Field of the Invention

The invention relates to a multi-layered, three-dimensional integrated circuit and to a method for fabricating a multi-layered, three-dimensional integrated circuit.

2. Description of the Related Art

Multi-chip 2-dimensional module approaches currently used in the integrated circuit (IC) industry for interconnecting chips into an electronic system suffer from several significant limitations. These include: high electrical impedance between individual chips; low areal and vertical densities; and high cost, complexity and inefficiency in thermal management.

A particularly important limitation of 2-dimensional approaches is interconnect signal delay. Interconnect delays in large 2-dimensional chips have begun to increase per unit length in successive generations of IC technology. A need clearly exists, therefore, for technologies that reduce overall interconnect length in tandem with increasing device density.

One potential way of overcoming the shortcomings of 2-dimensional integrated circuits is the development of 3-dimensional integrated circuit technology. The fabrication of 3-dimensional ICs by several techniques has been previously reported. However, previous techniques still suffer from many disadvantages rendering such techniques less commercially advantageous. One shortcoming of known techniques is ineffective thermal management. Interlayer alignment tolerance is also a limitation of current techniques.

The present invention provides 3-dimensional integrated circuits, and methods of preparing the same, in which many of the problems of prior art systems, including signal delays and ineffective thermal management, are overcome.

SUMMARY OF THE INVENTION

In one aspect, the invention relates to a three dimensional integrated circuit comprising two or more integrated circuits, wherein each integrated circuit is at least partially separated from an adjacent integrated circuit by a cooling channel, and wherein at least two integrated circuits are electrically connected.

In another aspect, the invention relates to a method for fabricating a three dimensional integrated circuit.

DESCRIPTION OF THE CURRENT EMBODIMENT

The invention relates to a three dimensional (3d) integrated circuit and to a method for fabricating a three dimensional integrated circuit system. The 3d circuit comprises two or more integrated circuits, each integrated circuit being at least partially separated from an adjacent integrated circuit by a cooling channel. At least two integrated circuits are electrically connected.

The 3d circuit is fabricated by: forming an integrated circuit; and stacking two or more integrated circuits such that at least two of the stacked circuits are electrically connected.

The step of creating an integrated circuit comprises: providing a substrate, a sacrificial layer overlying a surface of the substrate (or the sacrificial layer may be a sacrificial portion of the substrate), a first protective layer overlying the sacrificial layer, and a semiconductor layer overlying the first protective layer; forming circuitry in the semiconductor layer to provide an active layer; forming one or more electrically conductive feedthroughs through the active layer, the first protective layer, and the sacrificial layer, to the surface of the substrate; forming interconnect metallizations; forming one or more interlayer trenches or release holes through the first protective layer and the sacrificial layer; removing the substrate releasing an integrated circuit; stacking, electrically connecting two or more integrated circuits; and removing the sacrificial layers. For clarity, the method of the invention is described as a sequence of steps. However, as will be appreciated by those skilled in the art, the invention is not limited to the order is possible without departing from the scope of the invention.

Figure 1:
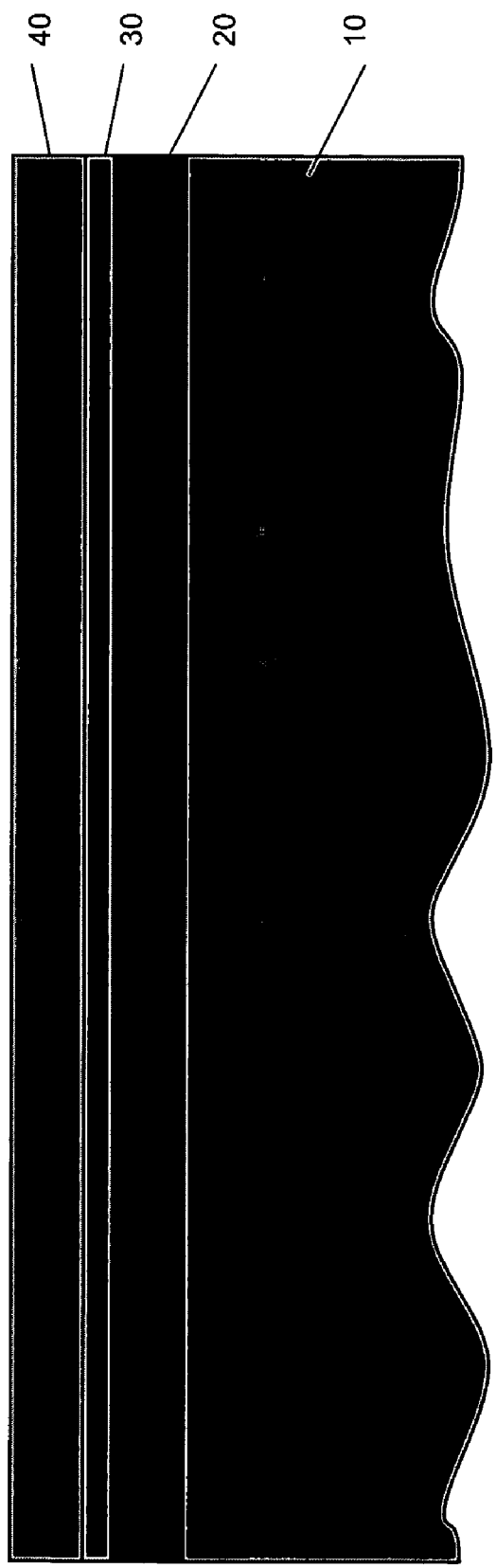
FIG. 1 is a schematic cross-sectional diagram of a layered substrate.

Referring now to FIG. 1, a layered substrate is initially formed by substrate 10, sacrificial layer 20, first protective layer 30, and a semiconductor layer. When processed as discussed below, the semiconductor layer provides active layer 40.

Sacrificial layer 20 is preferably approximately 30 µm to 70 µm in thickness. Suitable materials for the sacrificial layer 20 include $SiO_2$, $Si_3N_4$, lime glass, or P-doped glass. Alternatively, sacrificial layer 20 may be substrate silicon, in which case sacrificial layer 20 is in fact comprised of the top most 30–70 µm of substrate 10. For simplicity, the term "sacrificial layer" is used to refer to both embodiments of the layer.

First protective layer 30 is a dielectric material and is preferably approximately 0.5 µm to 3 µm in thickness. Suitable materials for first protective layer 30 include $SiO_2$, $Si_3N_4$, lime glass, or P-doped glass. Other dielectric materials known in the art may be used. Preferably sacrificial layer 20 and first protective layer 30 are different materials.

Suitable semiconductor layers include single crystal silicon, SiGe, Ge, GaAs, InP, InGaAs, and other compound semiconductors.

In a preferred embodiment, the layered substrate is a wafer bonded silicon on insulator (SOI) such as that shown in FIG. 1. In one example, the SOI includes a 0.1 to 2 µm layer of single crystal silicon, on approximately 1000 to 3000 angstroms of $Si_3N_4$, on approximately 30 to 70 µm of silicon dioxide on a substrate such as bulk single crystal silicon. In another example, the SOI includes approximately 0.1 to 2 µm of single crystal silicon on approximately 1000 to 3000 angstroms of $SiO_2$, on approximately 30 to 70 µm of $Si_3N_4$ on a substrate such as bulk silicon. In a further example, the SOI includes approximately 0.1 to 2 µm of single crystal silicon on approximately 1000 to 3000 angstroms of $SiO_2$, on a substrate such as bulk silicon, the topmost 30 to 70 µm of the substrate being sacrificial.

The semiconductor layer discussed above is processed to form active and passive devices as required, resulting in active layer 40. Active and/or passive devices may be formed, for instance, by CMOS processing, bipolar processing, bipolar/CMOS processing, and memory processing techniques (such as DRAM, SRAM, MRAM, and NVM).

Gallium arsenide, or other alternative semiconductor materials such as indium phosphide or aluminum gallium arsenide, may also be used to process individual layers, as long as the interconnect technology is compatible. This is particularly advantageous for imager device applications in which the topmost layer must be optically active. The devices are isolated by intermetal dielectric layer deposition. A typical SOI isolation of devices with deep trench oxidation to reduce capacitance/crosstalk between transistors and wells may also be carried out. Alternatively, the insulating walls of the electrical feedthroughs may also serve as isolation.

Figure 2A:
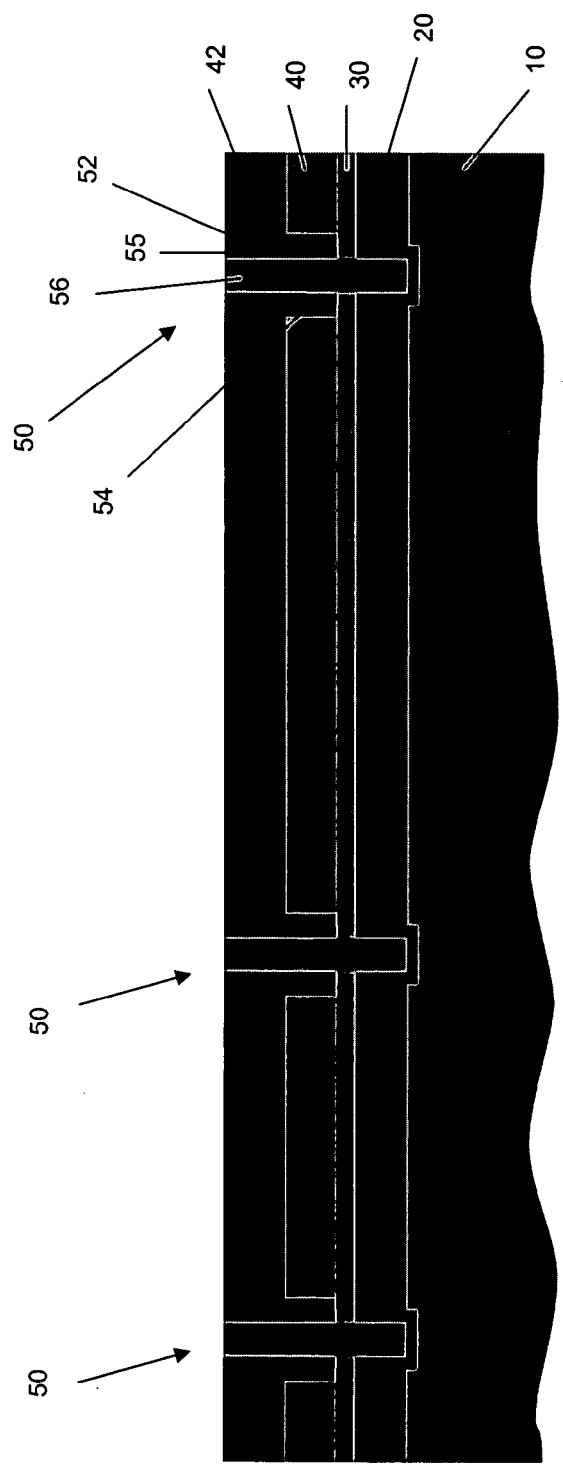
FIG. 2A is a schematic cross-sectional diagram of a layered substrate processed according to the methods of the invention.

Following formation of active layer 40, one or more electrically conductive feedthroughs 50 are created through active layer 40, first protective layer 30, and sacrificial layer 20, to the surface of substrate 10 (FIG. 2). The feedthroughs are formed by etching trenches through the active layer 40, up to the buried sacrificial layer 20/substrate 10 boundary, using substrate 10 as an etch stop. The trench is preferably approximately 3 to 10 µm wide, and approximately 30 to 80 µm deep. The trench can be round, square, cruciform, or other geometry. Methods of forming trenches include, for instance, reactive ion etching (RIE). Trench formation can be carried out in single or multiple steps.

If the sacrificial layer 20 is itself substrate Si without another material to act as an etch stop, there may be a certain amount of non-uniformity of trench depth across a wafer. State of the art trench etch systems can deliver less than 5% non-uniformity in trench depth and less than 5% additional non-uniformity in etch rate from wafer to wafer. This non-uniformity can be accomodated by allowing extra etch time and depth (typically >10% extra) so that all of the feedthroughs that are fabricated using the etch and fill technique extend all the way to the bottom of the sacrifical layer.

A second protective layer 54 is then deposited on trench walls 52. Preferably, second protective layer 54 is a dielectric material, such as Si3N4, SiO2, or both. Second protective layer 54 is approximately 0.2 µm to 1 µm in thickness.

A barrier layer 55 may be deposited over second protective layer 54. Barrier layer 55 is preferably Ta, TiN, Si3N4, or combinations thereof, and is approximately 0.02 µm to 0.2 µm thick.

The trenches are then filled with a conductor 56. Conductor 56 extends below active layer 40 by up to approximately 75 µm, and forms a downward extending post to the surface of substrate 10. Suitable conductors 56 include aluminum, tungsten, copper, gold, silver, doped polysilicon, tantalum, titanium, titanium nitride, or other conductive materials. Tantalum is resistant to corrosion, and so is useful in applications where the cooling fluid (discussed below) is, for instance, water. A preferred conductor 56 is copper, which is preferably electrochemically deposited by standard deposition techniques in a single damascene structure. Any overburden can be removed by chemical mechanical planarization (CMP). The feedthroughs formed in this step can be designed to surround a specific area on the surface of the active layer, for instance to form an almost complete faraday cage for particularly high noise or noise sensitive devices. The faraday cage may be grounded to provide increased isolation.

Figure 2B:
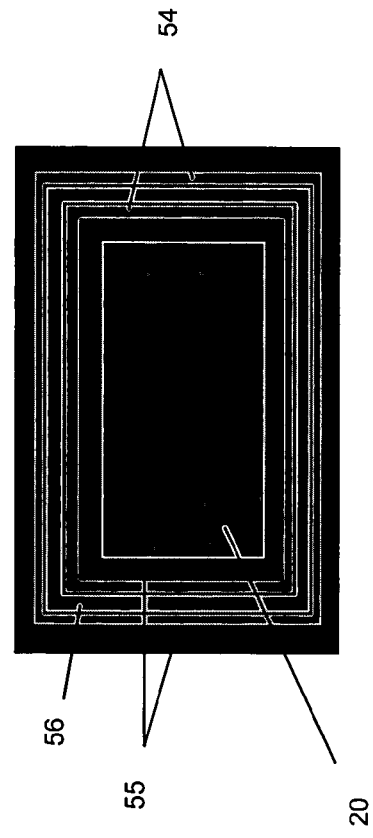
FIG. 2B is a schematic cross-sectional diagram of a reinforced feedthrough.

In an alternative embodiment, extra mechanical support between stacked integrated circuits (stacking of integrated circuits is discussed below) can be provided by forming reinforced feedthroughs. An example of a reinforced feedthrough is depicted in FIG. 2B. The reinforced feedthrough comprises sacrificial layer 20, surrounded by consecutive layers of second protective layer 54, conductor 56, and barrier layer 55. Second protective layer 54, conductor 56, and barrier layer 55 may have the same thickness as described above. Preferably, the reinforced feedthrough is approximately 10 to 100 µm wide by approximately 10 to 100 µm long. In this embodiment, the small amount of sacrificial material surrounded by the second protective layer 54, conductor 56, and barrier layer 55 is not removed in subsequent etching steps.

Figure 3:
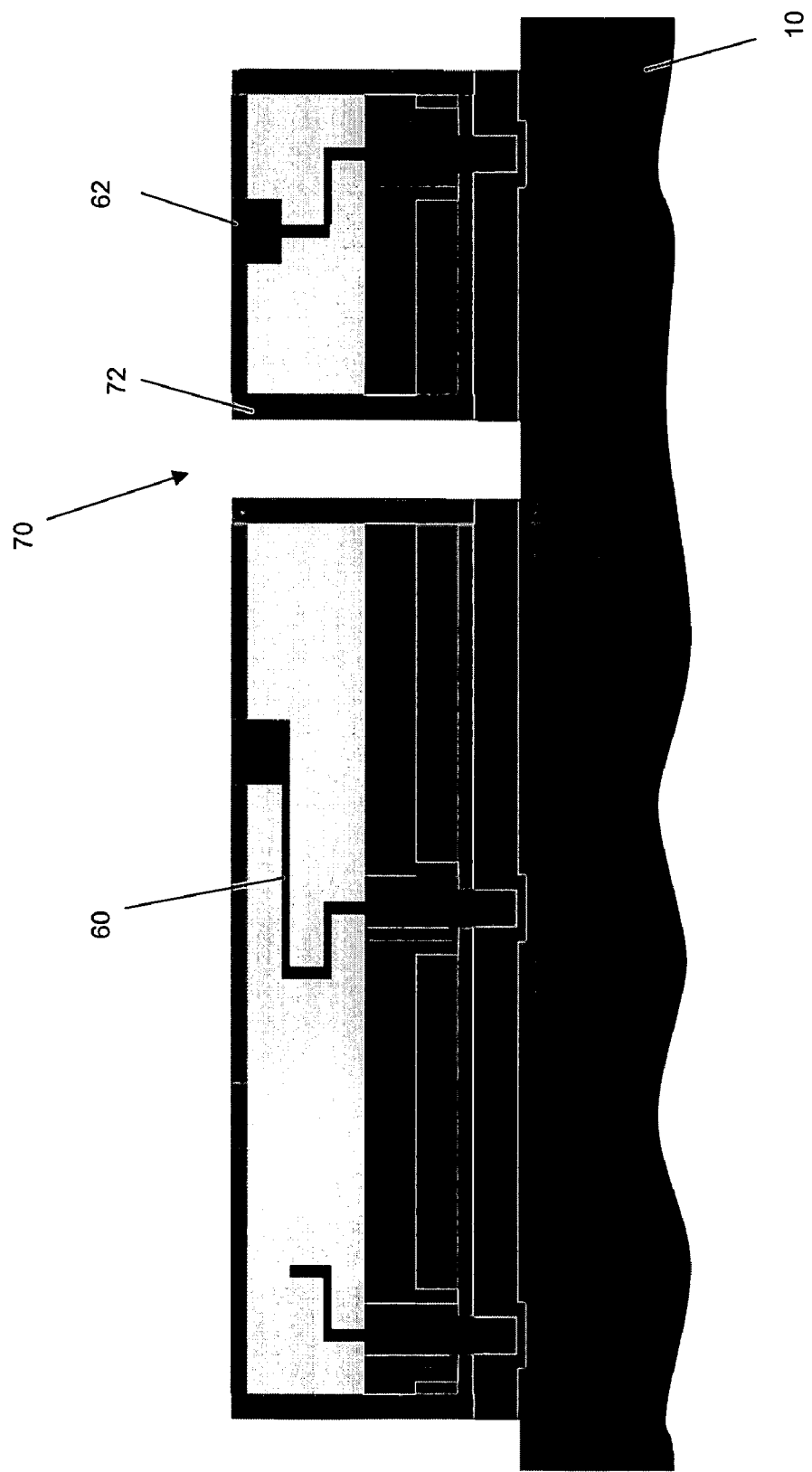
FIG. 3 is a schematic cross-sectional diagram of a layered substrate processed according to the methods of the invention.

Following feedthrough formation, the next step in the process of the invention is the formation of interconnects 60 (FIG. 3), as necessary, in the active layer, and bond pads 62 on the surface of the structure. Interconnects are formed by interconnect metallization. The step also includes formation of interconnects as required to one or more of the conductive feedthroughs 50, to allow connection of two or more active layers in different integrated circuits.

Optionally, a layer of metal or dielectric can be deposited on the structure so far prepared, in order to improve the strength and rigidity of the active layer. For instance, 5 µm of copper or silicon carbide can be deposited.

The next step is the passivation of the integrated circuit. Passivation can be conducted by depositing an approximately 0.2 to 2.0 µm top layer of dielectric, such as Si3N4. Additional layers may be deposited on top of the passivation layer. For instance, a hard top layer having a coefficient of thermal expansion similar to the dielectric layer underlying the active layer to reduce or prevent warping of the integrated circuit.

As an optional step, extra metal posts of approximately 20 to 60 µm may be grown upwards from the top surface of the structure so far formed by electrodeposition. Such posts can act as studs to either mate with feedthroughs on an adjacent integrated circuit, or can be used to increase the physical strength of the resultant stack. These upward-directed posts can also reduce the number of feedthroughs needed in an adjacent circuit, thus reducing the loss of device density on the active layer of the adjacent circuit. As an additional optional step, SiO2 mechanical support posts of approximately 30–50 µm in height maybe deposited upwards so as to form mechanical connections to the protective layer of the adjacent circuit. These posts can be made independently of the electrical feedthroughs and are beneficial because they do not require sacrificing active silicon area to allow support of the layers above.

A final CMP step can be carried out to planarize the structure, including bond pads present on the surface.

As a further optional step, additional conductor, such as copper, can be deposited on bond pads 62 to produce a controlled overburden, preferably in limited concave shape. The concave overburden can improve the resultant bond between the bond pad, and a downward extending feedthrough of an adjacent circuit. Preferred methods for forming concave overburden include electroplating or electroless plating. Additional concavity is producible by CMP with a soft polishing pad. During the CMP process, the semiconductor layer is preferably removed to a greater extent than the bond pad, thus recessing the semiconductor layer and further providing a concave shape. A recess of approximately 1 µm or more is preferred.

The next step is the formation of a release hole in the structure. Release hole 70 forms part of a network of cooling channels, that allow fluid cooling of the final 3-dimensional integrated circuit. Release hole 70 can also serve to separate the dice on the surface of the wafer and to facilitate removal of the sacrificial layer 20. Release hole 70 is formed by a two step interlayer etch. The first step of the interlayer etch involves the formation of a trench through the layers of the structure, for example by RIE, down to the surface of first protective layer 30. A side wall spacer (SWS) layer 72, such as such as approximately 1000–3000 Å of Si3N4, is deposited on the walls of the trench. Then etching of the trench is continued down to the surface of substrate 10.

Preferably, release hole 70 is approximately 5–10 µm wide. In a particularly preferred embodiment, release hole 70 is shaped as an alignment cross, so as to facilitate subsequent layer-layer alignment.

Figure 4:
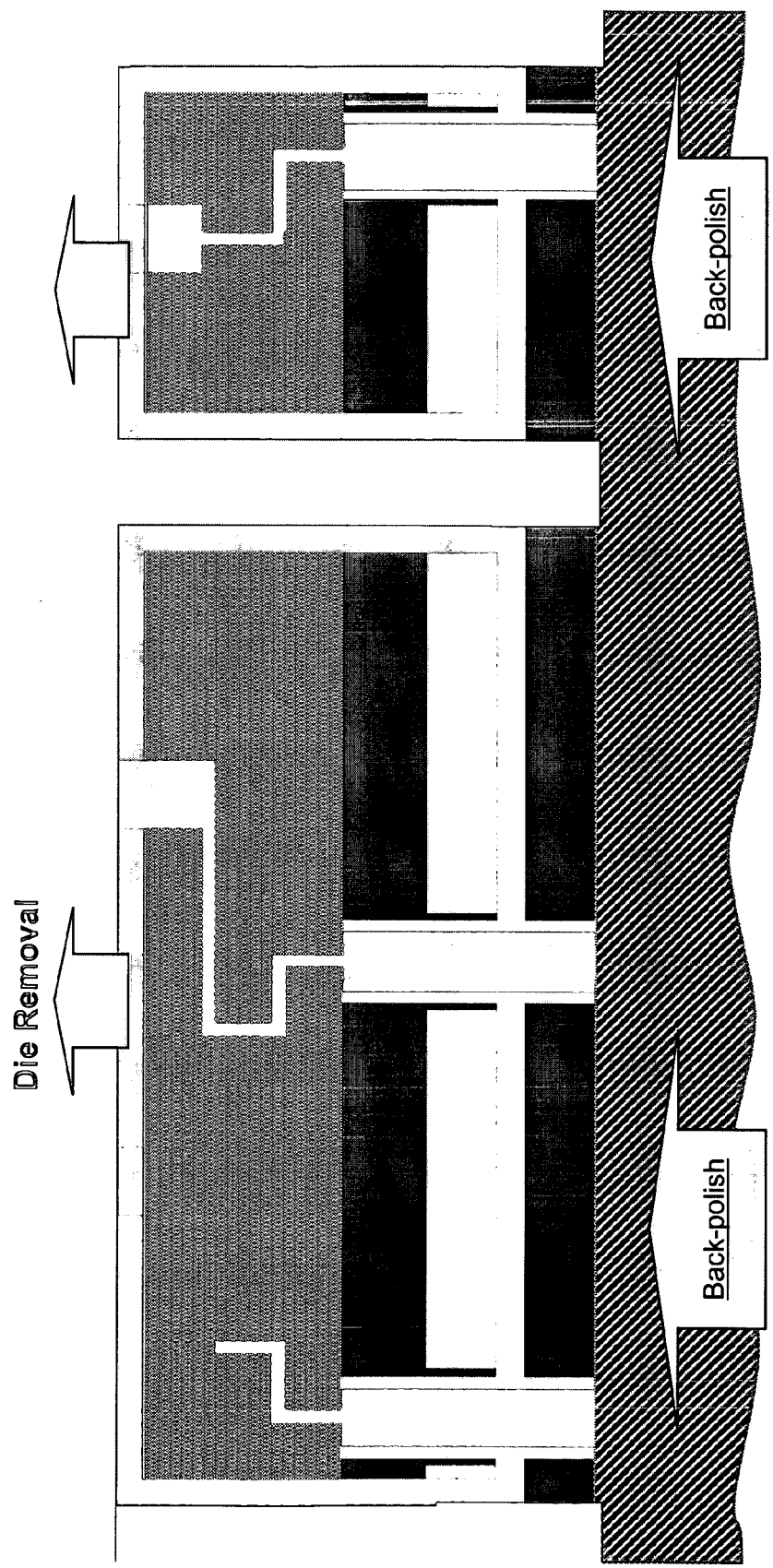
FIG. 4 is a schematic cross-sectional diagram of a layered substrate processed according to the methods of the invention.

Substrate 10 is then removed by a back-polish step (see FIG. 4). The back-polish step is preferably a combination of mechanical lapping and chemical mechanical planarization. Sufficient overpolish is conducted to remove barrier layer 54 and any additional layers described in paragraph [0026] from the bottom of feedthroughs 50, thus exposing the copper ends, or other conductive material, of the feedthroughs 50.

Figure 5:
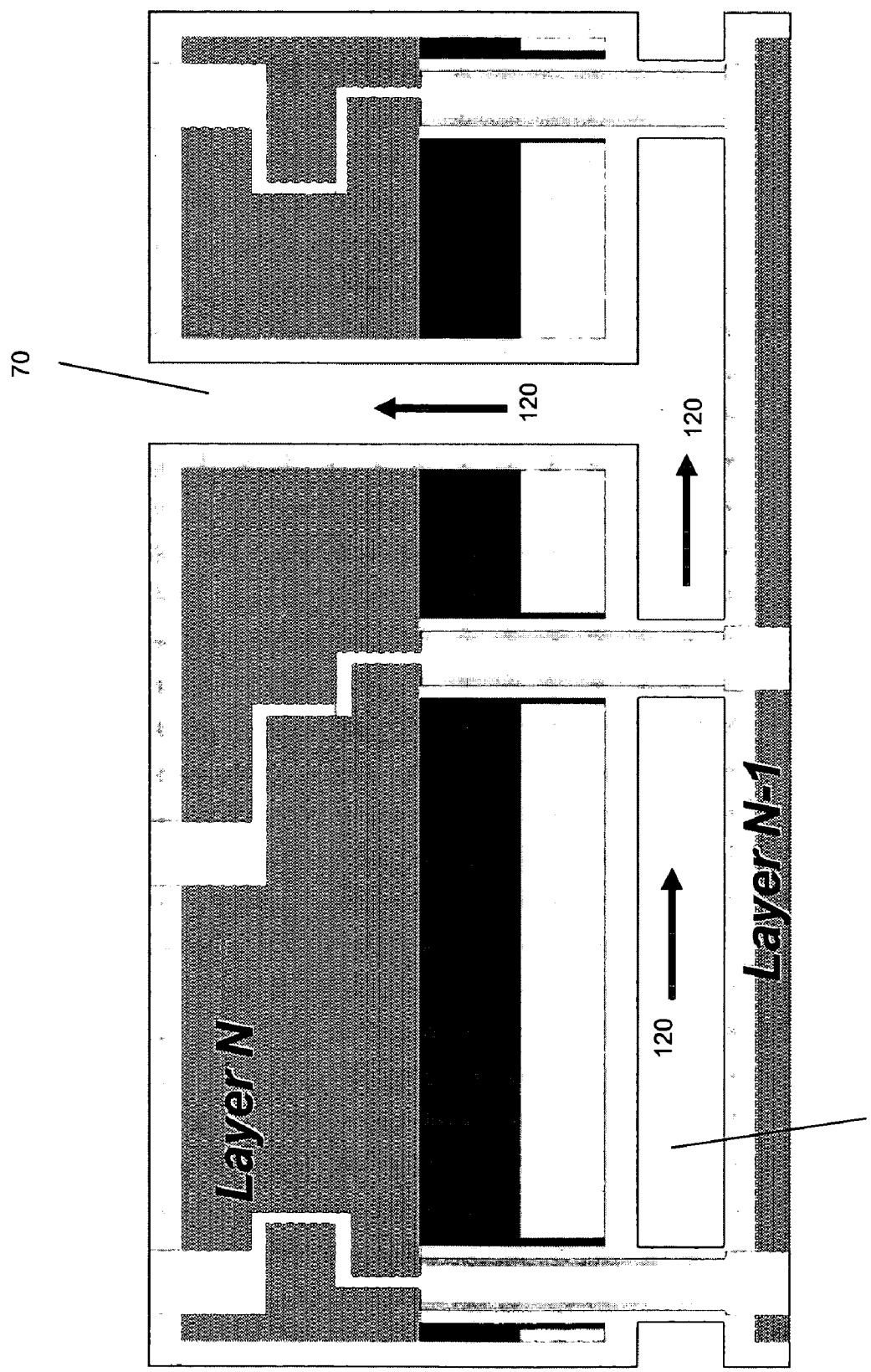
FIG. 5 is a schematic cross-sectional diagram of a three dimensional integrated circuit of the invention.

Following the back-polish step, wafer dicing and pick and place die removal of functional die are carried out. The functional die are then stacked and aligned (FIG. 5). Stacking is conducted by aligning and resting feedthroughs protruding from the bottom of a prepared circuit with bond pads on the surface of an adjacent structure. Several techniques can be used for proper alignment of the stacked circuits. For instance, release holes 70 can be placed in appropriate patterns to act as guides for laser alignment. Alternatively, the edges of the die can serve as alignment guides.

Conductor-conductor connection between feedthrough ends 58 on a circuit and bond pads 62 on an adjacent circuit are created. Connections can be made by mechanical bonds, formed by physically pressing a feedthrough end and a bond pad together.

In one embodiment, feedthroughs on one circuit are tantalum, and bond pads 62 on an adjacent circuit are copper. In a preferred embodiment, the feedthroughs on one circuit and bond pads 62 on an adjacent circuit are both copper, and a connection is formed by heating at approximately 400° C. to provide a thermal bond. Alternatively, the connection is created by a plasma bond, which can be formed at approximately 200° C. The connections are carried out in an inert atmosphere, such as a under nitrogen gas, in order to improve copper to copper bonding. Prior to forming the connection, the conductor is optionally cleaned, for instance by an acid dip. Surface conductors (such as bond pads 58) can also be cleaned by CMP.

If the feedthroughs are protected by SiO2, this can be exploited to form an additional bond between the feedthroughs and the layer underlying them. A permanent SiO2—SiO2 bond can be formed by pressure or heat treatment of polished SiO2 surfaces. Thus, these bonds can be formed at the same time as the conductor-conductor thermal bond.

Sacrificial layers 20 in the stacked structure are then removed by etching, to provide a cooling channel 110. Suitable etchants for dissolving sacrificial layer 20 include HF if the layer is silicon dioxide, hot concentrated H3PO4 if the layer is silicon nitride, or plasma fluorine if the layer is substrate silicon. The flow of the etchant is facilitated by release holes 70. The resulting cooling channel 110 is about 20 µm to about 60 µm, preferably about 30 µm to about 40 µm, deep. Generally, the design of the entire system determines the choice of size of the cooling channel. For instance, with higher power devices, the cooling gap is preferably larger or may be selected to be larger for higher power devices in a system stack.

A cooling network, formed by cooling channels 110 and release holes 70, allows for the efficient cooling of the three dimensional integrated circuit. Because the walls of the cooling network are encased in nitride or oxide, various cooling fluids can be used to cool the structure, including liquids and gasses, and conductive liquids. Preferred fluids include water and Freon™, hydrocarbon oils, water containing surfactants, supercritical helium gas, liquefied gases such as liquid nitrogen, and alcohol coolants such as glycols, including ethylene glycol. Methods for pumping cooling fluids through the cooling network are described in Published Patent Application Nos. U.S. 2003/0164231A1 and U.S. 2004/0089442A1, each of which is incorporated herein by reference in its entirety.

The invention also relates to a three dimensional integrated circuit, the fabrication of which is described above. In a broad aspect, the 3d circuit includes two or more integrated circuits 100 separated from each other by cooling channel 110, as shown in FIG. 5. Contact between feedthrough 50 on one circuit 100 and bond pad 62 on the surface of an adjacent circuit provides an electrical connection between the integrated circuits. Additional components of the three dimensional integrated circuit, such as release holes, protective layers, barrier layers, mechanical support posts, etc., are as described above and as shown in the attached drawings.

Cooling channel 110 of the 3d integrated circuit is preferably approximately 20 µm to 60 µm, more preferably approximately 30 µm to 40 µm, high. In a preferred embodiment, the cooling channel occupies approximately 30% or more of the total volume of the space between the top-most interconnect metal level of a lower active layer and the bottom of the protective layer of the upper active layer. In another preferred embodiment, the cooling channel occupies approximately 50% or more of the total volume of the space between the top-most interconnect metal level of a lower active layer and the bottom of the protective layer of the upper active layer.

The 3d integrated circuit of the invention is cooled by circulating a cooling fluid through the cooling network, comprised of cooling channel 110 and release hole 70, as shown by arrows 120 in FIG. 5.

It should be understood that the foregoing disclosure emphasizes certain specific embodiments of the invention and that all modifications or alternatives equivalent thereto are within the spirit and scope of the invention as set forth in the appended claims.

What is claimed is:

1. A three dimensional integrated circuit comprising two or more stacked integrated circuits, wherein each stacked integrated circuit is at least partially separated from an adjacently stacked integrated circuit by a cooling channel, and wherein at least two stacked integrated circuits are electrically connected.

2. The three dimensional integrated circuit of claim 1 wherein integrated circuits are electrically connected by one or more electrically conductive feedthroughs.

3. The three dimensional integrated circuit of claim 1 wherein the cooling channel is approximately 20 µm to 60 µm deep.

4. The three dimensional integrated circuit of claim 2 wherein the electrically conductive feedthrough on one integrated circuit contacts a bonding pad on an adjacent integrated circuit.

5. The three dimensional integrated circuit of claim 1 wherein adjacent cooling channels between active layers are fluidically connected by one or more release holes.

6. The three dimensional integrated circuit of claim 2 wherein the electrically conductive feedthroughs are formed in an enclosure surrounding a non-electrically conducting material.

7. The three dimensional integrated circuit of claim 2 further comprising mechanical support posts between adjacent integrated circuits.

8. The three dimensional integrated circuit of claim 1 wherein each integrated circuit comprises an active layer having a top surface and a bottom surface, interconnect metallization levels adjacent the top surface of the active layer, and a protective layer adjacent the bottom surface of the active layer.

9. The three dimensional integrated circuit of claim 8 wherein the cooling channel occupies approximately 30% or more of the total volume between the top-most interconnect metallization level of one active layer and the protective layer of an adjacent active layer.

10. The three dimensional integrated circuit of claim 8 wherein the cooling channel occupies approximately 50% or more of the total volume between the top-most interconnect metallization level of one active layer and the protective layer of an adjacent active layer.

11. A three dimensional integrated circuit comprising two or more integrated circuits, wherein each integrated circuit is at least partially separated from an adjacent integrated circuit by a cooling channel, wherein at least two integrated circuits are electrically connected, and wherein the cooling channel is approximately 20 µm to 60 µm deep.

12. The three dimensional integrated circuit of claim 11 wherein integrated circuits are electrically connected by one or more electrically conductive feedthroughs.

13. The three dimensional integrated circuit of claim 12 further comprising mechanical support posts between adjacent integrated circuits.

14. The three dimensional integrated circuit of claim 11 wherein each integrated circuit comprises an active layer having a top surface and a bottom surface, interconnect metallization levels adjacent the top surface of the active layer, and a protective layer adjacent the bottom surface of the active layer.

15. The three dimensional integrated circuit of claim 14 wherein the cooling channel occupies approximately 30% or more of the total volume between the top-most interconnect metallization level of one active layer and the protective layer of an adjacent active layer.

16. A three dimensional integrated circuit comprising two or more integrated circuits, wherein each integrated circuit is at least partially separated from an adjacent integrated circuit by a cooling channel, wherein at least two integrated circuits are electrically connected, and wherein each integrated circuit comprises an active layer having a top surface and a bottom surface, interconnect metallization levels adjacent the top surface of the active layer, and a protective layer adjacent the bottom surface of the active layer.

17. The three dimensional integrated circuit of claim 16 wherein the cooling channel is approximately 20 µm to 60 µm deep.

18. The three dimensional integrated circuit of claim 16 wherein integrated circuits are electrically connected by one or more electrically conductive feedthroughs.

19. The three dimensional integrated circuit of claim 16 further comprising mechanical support posts between adjacent integrated circuits.

20. The three dimensional integrated circuit of claim 16 wherein the cooling channel occupies approximately 30% or more of the total volume between the top-most interconnect metallization level of one active layer and the protective layer of an adjacent active layer.

* * * * *